United States Patent [19]

Parker et al.

[11] Patent Number: 5,387,862
[45] Date of Patent: Feb. 7, 1995

[54] POWERED TESTING OF MIXED CONVENTIONAL/BOUNDARY-SCAN LOGIC

[75] Inventors: Kenneth P. Parker; Kenneth E. Posse, both of Fort Collins, Colo.

[73] Assignee: Hewlett-Packard Company, Palo Alto, Calif.

[21] Appl. No.: 88,279

[22] Filed: Jul. 6, 1993

Related U.S. Application Data

[63] Continuation of Ser. No. 817,014, Jan. 3, 1992, Pat. No. 5,260,649.

[51] Int. Cl.⁶ ............................................. G01R 31/28
[52] U.S. Cl. .................................. 324/158.1; 371/22.3
[58] Field of Search .................... 324/158.1, 73.1, 765; 371/22.3, 22.1

[56] References Cited

U.S. PATENT DOCUMENTS

| | | | |
|---|---|---|---|
| 4,534,028 | 8/1985 | Trischler | 324/73.1 |
| 4,588,945 | 5/1986 | Groves et al. | 324/158.1 |
| 4,601,032 | 7/1986 | Robinson | 371/23 |
| 4,872,169 | 10/1989 | Whetsel, Jr. | 371/22.3 |
| 4,879,717 | 11/1989 | Sauerwald et al. | 371/22.3 |
| 4,963,824 | 10/1990 | Hsieh et al. | 324/158.1 |
| 4,967,142 | 10/1990 | Sauerwald et al. | 324/73.1 |
| 5,027,353 | 6/1991 | Jarwala et al. | 371/27 |
| 5,132,974 | 7/1992 | Rosales | 371/22.3 |
| 5,270,642 | 12/1993 | Parker | 371/22.3 |
| 5,329,533 | 7/1994 | Lin | 371/22.3 |

FOREIGN PATENT DOCUMENTS

0543506A2 5/1993 European Pat. Off.

OTHER PUBLICATIONS

G. D. Robinson, J. G. Deshayes, "Interconnect Testing Of Boards With Partial Boundary Scan," Proceedings Of International Test Conference, Sep., 1990, Baltimore, USA, pp. 572–581.

Primary Examiner—Ernest F. Karlsen

[57] ABSTRACT

The (X,Y) positions of the nodes in a circuit containing boundary scan components and non-boundary-scan components are stored in a computer. The computer selects a set of non-boundary scan nodes within a radius R of a selected boundary-scan node, R being the length of solder bridges in the circuit. A logic 0 voltage is applied to the set and a boundary-scan test is performed. If the boundary-scan test fails, a fault is declared in the circuit between the set and the selected boundary-scan node. A logic 1 voltage is applied to one of the nodes in the set, and the test repeated. If the test returns different results, the fault is declared between that one node and the selected boundary-scan node. A time limit is established for each non-boundary scan node corresponding to the length of time a short in that node can be tolerated. The boundary-scan nodes in the circuit are tested in the order of ascending time limits in its associated set. Power is cut off to the circuit if the time limit of a node not yet tested, or tested and failed, is exceeded.

8 Claims, 4 Drawing Sheets

POWERED TESTING OF MIXED CONVENTIONAL/BOUNDARY-SCAN LOGIC

CROSS REFERENCE TO RELATED APPLICATION(S)

This is a continuation of copending application Ser. No. 07/817,014 filed on Jan. 3, 1992, now U.S. Pat. No. 5,260,649.

BACKGROUND OF THE INVENTION

1. Field of the Invention

The invention in general relates to apparatus and methods of testing electrical circuits and more particularly to apparatus and methods of testing circuits which include some circuit elements that include boundary-scan logic and some circuit elements that do not include boundary-scan logic.

2. Statement of the Problem

The testing of electrical circuits is nearly as old as electrical circuits themselves. In simple circuits this is done by applying small voltages to all the circuit nodes to test for shorts or open circuits. The term node in this specification means any equipotential circuit element; an example is a connecting wire or trace between two electrical components. As circuits have become more complex it has become ever more important and more difficult to thoroughly test circuits. A common way of doing this is to design a testing apparatus and method as part of the development program for every manufactured circuit, such as a circuit board for a TV. Generally a program is developed which is programmed into a complex testing machine which includes hundreds or even thousands of resources, such as voltage drivers and receivers, which are alternately connected to the nodes of the circuit via relays and contact nails in a programmed sequence to test the circuit. In complex circuits not every combination of nodes can be tested, since this could take longer than the age of the universe. So the test designer must develop some way to make sure that the nodes most likely to fail in the particular circuit are tested. This has become a very complex science utilizing higher mathematics and computers. See for example U.S. Pat. No. 4,601,032 issued to Gordon D. Robinson which devises and applies a complex waveform of test vectors (a set of digital voltages applied to a set of nodes) to the circuit elements to test the circuit, and U.S. Pat. No. 5,027,353 issued to Najmi T. Jarwala et al., which uses a weighted mathematical system to determine a compact set of test vectors to test the circuit. One problem with such tests is that the vectors or waves, which are pulses of voltage applied to the system, can damage the system, especially if there is a fault in the system and the voltages are applied for too long of a period. This can often happen because the systems are so complex that it takes a long time to run such tests. Another problem is that generally the better such tests are at finding that there is a circuit fault, the less likely it is that they are able to locate precisely where the circuit fault is. Since complex circuit boards are expensive, it is essential to know where the fault is so that it can be repaired. Another problem is that in modern electronic circuits with surface mount, fine geometries, and double-sided boards, not all nodes will be accessible, and thus cannot be tested by such methods.

One solution to the problem of potentially damaging devices during powered tests is found in U.S. Pat. No. 4,588,945 issued to William A. Groves et al., which describes a method of testing which provides a time limit for applying test signals and a cool down time in between test signals, the length of which time limit and cool down time is determined from the characteristics of the devices tested.

One solution to the problem of precisely locating system faults when not all nodes are accessible is called boundary-scan. Boundary-scan is a test system in which each component of a circuit, such as a chip, is constructed with a set of shift registers placed between each device pin and with a specific internal logic system. This system has been defined in an IEEE standard No. 1149.1-1990. The boundary-scan standard allows the entire circuit to be accurately tested by scanning only the boundary pins of the circuit. For a complete description of boundary-scan see *HP Boundary-Scan Tutorial and BSDL Reference Guide*, published by Hewlett Packard Company, Manual Part No. E1017-90001. See also U.S. Pat. No. 4,872,169 issued to Lee D. Whetsel, Jr., U.S. Pat. No. 4,879,717 issued to Wilhelm A. Sauerwald et al., U.S. Pat. No. 4,967,142 issued to Wilhelm A. Sauerwald et al., European patent application number 89308562.1 of Lee D. Whetsel, Jr., and European patent application No. 90305582.0 of Najmi T. Jarwala et al. which disclose various details of the implementation of boundary-scan.

The boundary-scan system described in the above references produces excellent results in circuits which are composed wholly of boundary-scan circuit elements. However, in the real world there are very few such systems. Usually an electronic circuit is composed of elements made by a wide variety of manufacturers, many of which do not use the boundary scan standard. The above references do not teach how to address the problem of testing such circuits.

The testing of mixed circuits, i.e. circuits which contain both conventional and boundary-scan circuit elements by boundary scan techniques presents two significant problems: 1) the boundary-scan test is a powered test—this means that in the presence of potentially damaging shorts, the circuit is powered and can be damaged; and 2) the presence of non-boundary scan elements compromises the boundary scan test in that a short between a non-boundary-scan element and a boundary-scan element will often cause the boundary scan node to have the wrong logic value, and the results are not likely to be repeatable because the conventional logic is on and is not predictable. See *Interconnect Testing of Boards with Partial Boundary Scan*, Gordon D. Robinson & John G. Deshayes, IEEE 1990 International Test Conference Proceedings, CH29100-6/000/0572, Paper 27.3, pages 572–581. The above paper discloses a method of solving the problem by a four part test: first, a conventional shorts test is done between all places to which the tester has access; second, the boundary circuit test circuitry and the path segments between components are tested to see they are working properly; third, a test for shorts between nodes with tester access and the boundary scan nodes without access are tested; Finally, a test for opens and shorts on the pure boundary scan nodes. The third test can have two forms. The simplest tests one node at a time; it forces a high on the node, does a boundary scan test, then forces a low on the node and performs another boundary scan test. If there is a short, one of these tests will likely produce a wrong result on the boundary scan test. The other form of the third test tests several nodes at once and each node is given a unique identifier signal. A short is declared when one of the boundary scan test nodes sees one of the identifiers. The problem with this test is that using the simplest form of the third test can take unacceptably long and use a large number of resources in a complex circuit and using the second form of the third test gives ambiguous results since the identifier can propagate to the boundary-scan node through nodes other than the driven node. This test also takes a long time since the number of sets to be tested can be very large.

Another system for testing mixed conventional and boundary-scan nodes is disclosed in U.S. Pat. No. 4,963,824 issued to Edward P. Heleb et al. The method disclosed replaces each circuit board component in turn with a testing device. The method also discloses isolating non-boundary scan components by applying special connector cards with boundary scan capabilities to the connectors around the component. This method is impractical since removing the devices and replacing them not only is unwieldy and time consuming, but destroys the very basis of the test: since the component must be replaced, and since the replacement can cause shorts or opens, the board should be retested afterwards. Attaching special cards to isolate the non-boundary scan components not only is time consuming, but assumes that the cards can be connected which is often not the case in complex, surface mounted and double sided boards.

In sum a need still exists for a test apparatus and method for mixed conventional and boundary-scan circuits that tests more than one node at a time, reduces the set of nodes tested to a manageable number, can unambiguously detect circuit faults, and does not require the physical alteration of the circuit.

3. Solution to the problem

The invention provides apparatus and methods for performing boundary-scan tests on mixed circuits that reduces the number of nodes to be simultaneously tested to a manageable number.

The invention provides apparatus and methods for performing boundary-scan testing of mixed circuits that permits the precise node that has the fault to be determined.

The invention provides apparatus and methods for performing boundary-scan tests on mixed circuits that for a given boundary-scan node tests only a relatively small set R of non-boundary scan nodes, where the set R is the set of all accessible non-boundary-scan nodes within a radius R of the boundary scan node, where R is a length related to the length of solder bridges on the circuit board to be tested.

The invention provides apparatus and methods for boundary-scan testing of mixed circuits that, if a set R is found which includes a fault, resolves the precise node of the set R that is causing the fault.

The invention also provides apparatus and methods for performing boundary-scan tests on mixed circuits that prevents damage to the circuit due to power being applied for too long a time.

The invention provides apparatus and methods for boundary-scan testing of mixed circuits that provides a test time limit for each boundary-scan node to be tested in the circuit, orders the boundary-scan nodes to be tested so that those with the shortest test time limit are tested first, and shuts off the power when the time limit is reached for nodes that have not been tested.

SUMMARY OF THE INVENTION

The invention provides apparatus for boundary-scan testing of circuits comprising: set means for providing a set of circuit elements within a radius R of a boundary-scan node within a circuit to be tested; test mean comprising: driver means for applying a first predetermined electrical value to the set of circuit elements; boundary scan means for performing a boundary-scan test on the circuit; and output means for providing an output indicative of the status of the circuit between the boundary-scan node and the set of circuit elements. Preferably, the circuit includes boundary-scan components and non-boundary-scan components, and the set means comprises means for providing the set of accessible non-boundary-scan circuit elements within the radius R of the boundary-scan node. Preferably the set means comprises means for selecting the radius R. Preferably, the driver means comprises means for applying a predetermined voltage to the set of accessible non-boundary-scan elements. Preferably, the voltage is a logic zero and the non-boundary-scan circuit elements are pins connected to non-boundary-scan nodes of the circuit. Preferably, the set means comprises; digital storage means for storing the X-Y locations of all pins connected to non-boundary-scan nodes of the circuit; and digital processor means communicating with the storage means for determining which of the pins are within a radius R of the boundary-scan node. Preferably, the radius R is a distance related to the length of solder bridges on the circuit board. Preferably, the apparatus further comprises resolving means for determining the status of the circuit between the boundary-scan node and one of the set of circuit elements. Preferably, the resolving means comprises: means for causing the drive means to apply a second predetermined electrical value to one of the set of circuit elements while applying the first predetermined electrical value to the other of the set of circuit elements; means for causing the boundary-scan mean to perform a second boundary-scan test on the circuit; and comparing means for indicating whether the results of the first boundary-scan tests are different than the results of the second boundary-scan test. Preferably, the first predetermined electrical value is a logic 0 voltage and the second predetermined electrical value is a logic 1 voltage. Preferably, the test means further comprises; clock means for counting time; power source means for applying power to the circuit; clock initiation means for initiating the count of the clock means upon application of power to the circuit; time limit means for providing a test time limit corresponding to the time for which a short circuit can be tolerated by the circuit; and power shutoff means communicating with the clock means for turning off the power to the circuit when the elapsed time since the application of power to the circuit becomes equal to the test time limit. Preferably, the time limit means comprises means for providing a test time limit for each boundary-scan node to be tested in the circuit, and node ordering means for ordering the boundary-scan nodes to be tested so that those with the shortest test time limit are tested first, and the power shutoff means comprises means for turning off the power to the circuit when the elapsed time since the application of power to the circuit exceeds the test time limit for a boundary-scan node that has not been tested or the time limit for a boundary-scan node that has been tested and failed. Preferably, the set means and the time limit means comprises a computer remote from and communicating with the test means. Preferably, the boundary-scan test comprises a boundary-scan EXTEST function. Preferably, the test means comprises: a power source; a plurality of electrical circuits including one or more drive circuits and one or more receiver circuits; a plurality of contact means for contacting the circuit elements; a plurality of relays for connecting the power source and the electrical circuits to the contact means; and a test controller means communicating with the contact means, the electrical circuit, and the relay for performing a predetermined test on the circuit.

In another aspect the invention provides a method of testing circuits having both non-boundary-scan circuit components and boundary-scan circuit components, each of the circuit components having one or more nodes, the method comprising: storing information on the (X,Y) position of nodes in the circuit; using the stored information on the (X,Y) position of circuit nodes to select a set of non-boundary-scan nodes for testing, the set of nodes being less than the total number of nodes in the circuit; applying a predetermined electrical value to the set of non-boundary-scan nodes; performing a boundary-scan test on at least one boundary-scan component of the circuit; and providing an output indicative of the status of a portion of the circuit associated with the set of non-boundary-scan nodes.

In yet another aspect the invention provides a method of testing circuits having both non-boundary-scan components and boundary-scan components, each of the components having at least one node, the method comprising: determining a set of non-boundary-scan nodes within a radius R of a boundary-scan node within the circuit; applying a predetermined electrical value to the set of non-boundary-scan nodes; performing a boundary-scan test on at least one of the boundary-scan components of the circuit; and providing an output indicative of the status of the circuit between the set of non-boundary scan nodes and the boundary-scan node. Preferably, the step of determining comprises determining the set of accessible non-boundary-scan nodes within the radius R of the boundary-scan node; and the step of applying comprises applying a first predetermined voltage to the set of accessible non-boundary-scan nodes. Preferably, the method further includes the step of selecting the radius R prior to the step of determining. Preferably the method further includes the step of performing an unpowered shorts test on the set of accessible non-boundary-scan nodes prior to the step of applying. Preferably the method further includes the steps of: applying a second predetermined voltage to at least one of the set of non-boundary scan nodes; performing a second boundary-scan test on at least one of the boundary-scan components of the circuit; and providing an output indicative of the status of the circuit between the boundary scan node and at least one of the set of non-boundary-scan nodes. Preferably, the test is repeated sequentially for a plurality of boundary-scan nodes in the circuit and further includes the steps of: determining a time limit associated with each of the boundary-scan nodes; sequencing the order of tests on the plurality of boundary-scan nodes in the order corresponding to the length of the associated time limit, with the boundary-scan node with the shortest time limit being tested first; applying power to the circuit at the beginning of the first of the tests and initiating the count of a clock when the power is applied; and shutting off the power to the circuit if the count of the clock exceeds either the time limit for a node not yet tested or the time limit for a node that has failed the test.

The invention provides apparatus and methods that not only allow one to relatively quickly and precisely determine circuit faults, but also can be implemented on conventional testers with boundary-scan capability. Numerous other features, objects and advantages of the invention will become apparent from the following description when read in conjunction with the accompanying drawings.

DESCRIPTION OF THE PREFERRED EMBODIMENT

1. OVERVIEW

Figure 1:
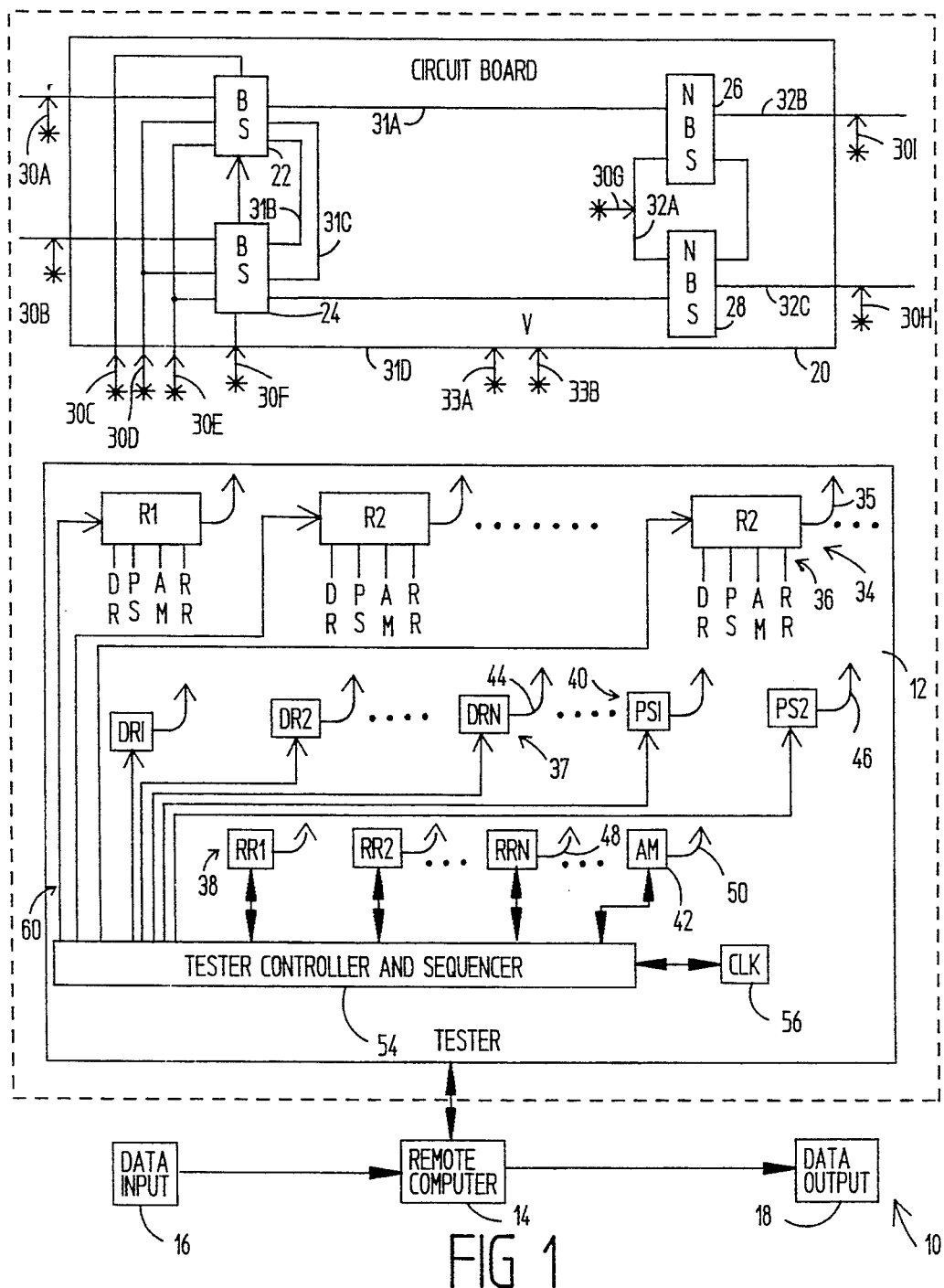
FIG. 1 is a block diagram of the preferred embodiment of apparatus for testing mixed circuits according to the invention.

Turning now to FIG. 1, a block diagrammatic view of a preferred embodiment of a circuit testing system 10 according to the invention is shown. The system 10 includes a tester 12 and a remote computer 14 having a data input 16, such as a LAN, telephone, disc or tape drive, keyboard, etc., and a data output 18, such as a display, printer, disk or tape drive, etc. An exemplary circuit board 20 to be tested includes two boundary-scan components 22 and 24 and two non-boundary-scan components 26 and 28. The circuit has six nails 30A through 30F which provide access to six "boundary" or "external" nodes of the boundary scan components 22 and 24 and three nails 30G through 30I which provide access to three nodes of the non-boundary-scan components 26 and 28. There are also one or more nails 33A and 33B which provide the circuit power supply. The "internal" boundary-scan nodes 31A through 31D have no access via nails. In an actual circuit to be tested, there may be hundreds of components and hundreds or even thousands of nodes and nails. The tester 12 has a multiplicity of relays 34, each of which has a contact means, such as 35, for electrically contacting the nails 30A through 30F and 31A through 31C. Each relay also has a plurality of input/output lines 36. The tester 12 also has a multiplicity of drivers 37 and receivers 38, a plurality of power sources 40, and at least one analog module 42, each of which has a means, such as 44, 46, 48, and 50 for connecting to the input/output lines 36 of the relays 34. There may be hundreds of relays 34, drivers 37, and receivers 38 and tens of different power sources in a typical tester. The tester 12 also includes a controller and sequencer 54 and a clock 56 which communicates with the controller-sequencer 54. In general, the controller-sequencer 54 communicates with each of the relays 34, drivers 37, receivers 38, power sources 46, and analog module 42 via cables 60 and controls the system to apply a programmed sequence of signals from power sources 40, drivers 37, and analog module 42 to predetermined ones of the nails 30A through 30I, and the receivers 38 receive, via relays 34, and pass on to the controller-sequencer signals from other predetermined ones of the nails 30A through 30I.

More particularly, according to the invention, information regarding the X-Y locations of the boundary-scan nodes without nails, i.e. nodes 31A through 31D, and the non-boundary scan nodes with nails, i.e. nodes 32A through 32C, is fed into remote computer 14 via data input terminal 16. From this information, sets T of non-boundary-scan nodes 32A through 32C within a radius R of each boundary-scan node 31A through 31D are defined. For example, for the simple circuit shown in FIG. 1, the set T corresponding to the node 31A may be the single node 32A. Then, via input terminal 16 and computer 14, the controller-sequencer 54 of tester 12 is programmed to perform a test. Under a test program according to the invention, one of the drivers 37 would be assigned to each nail 30A through 30I and one of the receivers 38 is assigned to each nail 30A through 30F. First a conventional unpowered shorts test is run on the accessible nodes, i.e. the nodes connected to the nails 30A through 30I. If the circuit 20 passes this test, then the circuit 20 is powered up by application of power to the circuit power inputs 33A and 33B via power sources 40 and relays 34. A boundary-scan node is selected, say node 31A, a logic zero is applied to the corresponding set T, i.e. node 32A, via nail 30G, and a boundary-scan test is run on the boundary-scan nodes on the boundary of the circuit via nails 30A through 30F. If the proper signals as defined by the boundary-scan test are not received by the receivers connected to the nails 30A through 30F, then the set T is recorded as having a fault. Another boundary scan node is selected, a logic zero signal is applied to its corresponding set T, and another boundary scan test run on the boundary scan nodes on the boundary of the circuit. This is continued until all non-accessible boundary-scan nodes 31A through 31D are tested. There may be no nodes in the set T for some boundary-scan nodes, such as 31C, so a boundary-scan test would not be run for those boundary-scan nodes. If the number of nodes in one or more sets T is small, then several sets may be run in parallel, i.e. run at the same time. If there is more than one non-boundary-scan node in the set T, and a set, or group of sets, has been recorded as faulty, then one node within that set, or group of sets, is set to a logic 1, all other nodes are held to a logic 0, and the boundary scan test run again. If the results change from what they were when that node was held to a logic 0, then that node is identified as faulty. All nodes within the faulty set T would be so tested. At the time of setting up the test with data input terminal 16 and computer 16, a time limit may be defined for each non-boundary scan node, which time limit corresponds to the length of time the circuit can tolerate a short between that node and a boundary-scan node. The boundary-scan nodes to be tested are then ordered by the length of the time limits associated with the non-boundary scan nodes in their associated sets T, with the one with the shortest time limit being first. As soon as possible after power up of the circuit 20, clock 56 is reset. After each node is tested, the time limit of the nodes yet to be tested are compared to the clock time, and if the clock time equals or exceeds any of these limits, the test is temporarily aborted and the power to circuit 20 is turned off. The test may be restarted after the circuit has had a chance to cool down. After completion of this test of the mixed nodes, a standard boundary-scan interconnect test may be run.

2. DETAILED DESCRIPTION

Figure 2:
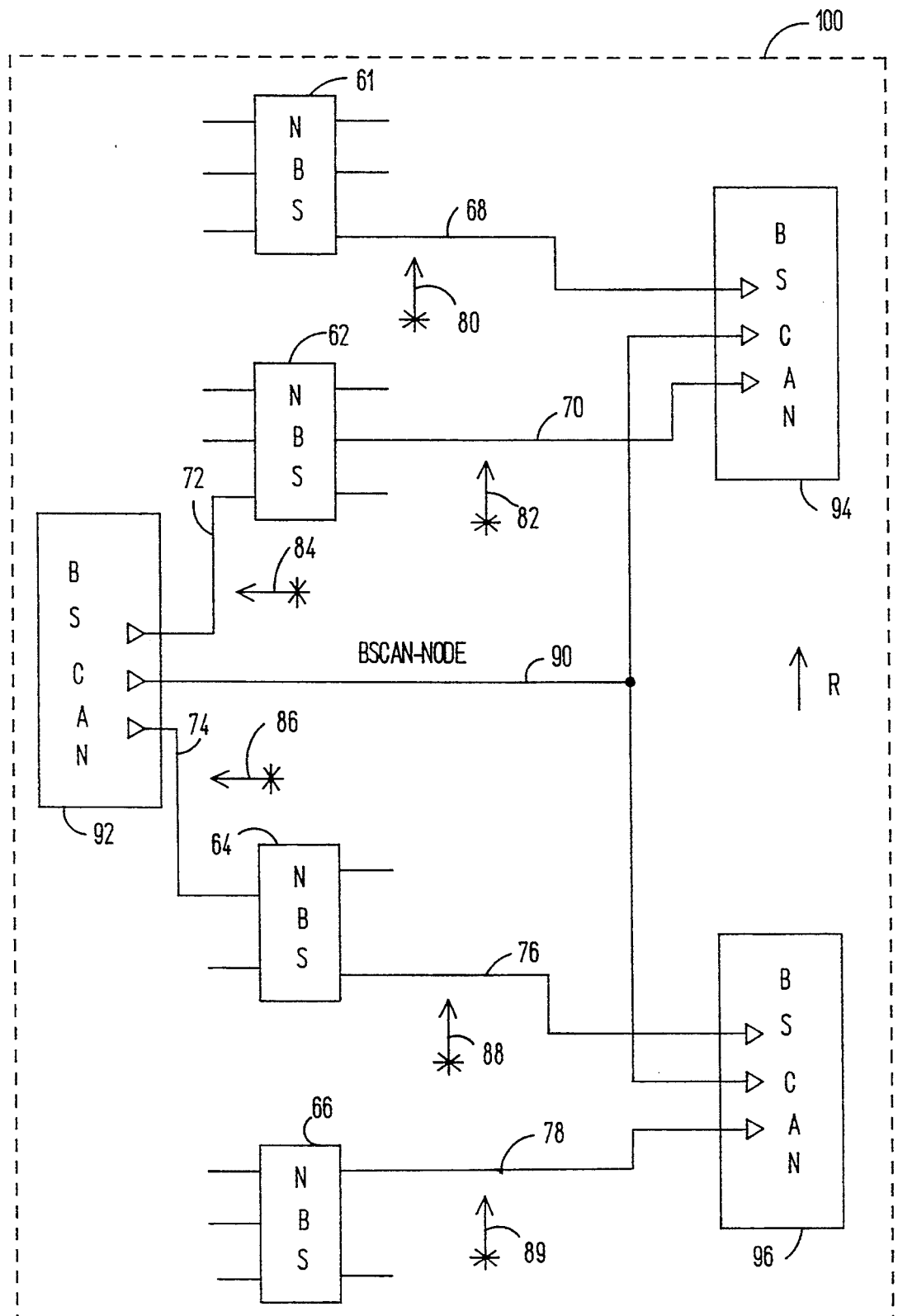
FIG. 2 shows a sample of a mixed circuit with an exemplary radius R superimposed.

Turning now to a more detailed description of the invention, FIG. 2 shows an exemplary circuit board 100 which is useful in describing how the set T is determined. Circuit board 100 includes three boundary-scan devices 92, 94, and 96, and four non-boundary-scan-devices 61, 62, 64, and 66. Boundary-scan devices 92, 94, and 96 contain IEEE 1149.1-1990 boundary-scan circuitry. Attached to nodes 68, 70, 72, 74, 76, and 78 are in-circuit test probes, generally referred to herein as "nails", 80, 82, 84, 86, 88, and 89, respectively. Node 90, which is selected as the boundary-scan node to be tested, does not have a nail connected to it. Hundreds or even thousands of other nodes, many with nails, may exist on board 100, however, these will not be discussed herein.

A "shorting radius" R, with length shown by the arrow in FIG. 2, is selected. The length of shorting radius R may be any length that is related to a physical property of the circuit and is calculated to reduce the number of nodes to be tested. Preferably, it refers to a maximum linear distance between two device pins over which a short may be likely. In this example we focus on the distance between pins only, rather than the distance between two nodes over their whole length, because it is assumed that circuit board 100 is soldered by state-of-the-art soldering techniques in which all of the circuit except the pins is masked, and thus solder only can stick to the pins. Preferably, the length R represents the maximum expected span of solder blobs or bridges, also known as solder defects, on circuit board 100. It should be understood that R is a user-definable length, which is set consistant with the user's experience and/or expectations regarding the length a short is likely to cover. The particular length chosen will depend on many factors, such as the soldering technique used to solder the board, the solder temperature, the length of time the board 100 was exposed to the solder, the required degree of certainty that shorts will be detected, etc. Given the (X,Y) locations of two pins, i.e. (a, b) and (c,d), the distance between them is given by the square root of $((a-c)^2+(b-d)^2)$. If this value is equal to or smaller than the shorting radius R, then these pins are candidates for shorting and must be tested. That is, the algorithm that defines the set T is those accessible non-boundary-scan nodes for which $((a-c)^2+(b-d)^2)^{\frac{1}{2}} \leq R$ where (a, b) is the (X,Y) location of the pins of the boundary-scan node selected and (c,d,) is the (X,Y) location of the accessible non-boundary-scan node pins.

With the length R as shown by the arrow selected, we examine the circuit on board 100. Looking at the boundary-scan device 92, we see that within a radius R of the pin of node 90 are the pins of two other nodes, 72 and 74, that connect device 92 to non-boundary-scan devices 62 and 64 respectively. These nodes are within the "shorting radius R" as defined by the algorithm. Looking at boundary-scan device 94, we see that adjacent to the pin of node 90 are the pins of two other nodes, 68 and 70, that connect device 94 to non-boundary-scan devices 61 and 62. These nodes, 68 and 70 are within the shorting radius R as defined by the algorithm. Looking at boundary-scan device 96, we see that adjacent to the pin of node 90 there are pins of two other nodes, 76 and 78, that connect device 96 to non-boundary-scan devices 64 and 66. These nodes, 76 and 78, are also within the shorting radius R as defined by the algorithm. Looking at the rest of the circuit on circuit board 100 we see that there are no other nodes that are with in the shorting radius R of boundary-scan node 90. Thus the set T for boundary-scan node 90 is the set of nodes 72, 74, 68, 70, 76, and 78. While in reference to the exemplary circuit 100, we were able to determine the set T by observation, in the preferred embodiment the (X,Y) coordinates of the accessible pins are input into remote computer 14 by means of data input 16, which may be a LAN, telephone line, CDROM, disk or tape drive, keyboard or other data input mechanism. Computer 14 is programmed with the above-discussed algorithm, an R is selected, and the computer 14 calculates the set T for each boundary-scan node, and upon directions from the keyboard in data input 16, provides the set information to tester 12.

In the preferred embodiment of the invention conventional unpowered shorts testing is performed prior to the novel testing using the set T according to the invention. In the unpowered shorts testing tester 12, under control of a program input by remote computer 14, applies a low voltage signal on one nail, via one of drivers 37 and relays 34, and looks for that voltage on the other nails, via relays 34 and receivers 38. This test can only be performed on nodes to which tester 12 has physical access, i.e. the nodes that have nails attached. Referring to FIG. 2, the nodes 68, 70, 72, 86, 76, and 78 can be tested for shorts in this way utilizing nails 80, 82, 84, 86, 88, and 89 respectively. Since unpowered shorts testing depends on nail access to nodes, it is becoming less and less possible with advances in physical integration of circuits. If a short is found in the unpowered shorts testing, the rest of the tests are preferably not performed until the board has been repaired and unpowered shorts testing does not show any faults.

As part of the mixed test according to the invention, a conventional boundary-scan test is performed on the boundary scan nodes, that is the nodes connecting boundary-scan devices. For example, referring to FIG. 2, the node 90 is driven by a boundary-scan driver on device 92 and monitored at each receiving pin on boundary-scan devices 94 and 96. This test does not require nail access to node 90. In effect, access to node 90 is granted by the boundary-scan protocol, which allows internal nodes to be driven by drivers in the boundary-scan circuitry as determined by signals applied to the external boundary-scan nodes, e.g. the nodes connected to nails 30A through 30F in FIG. 1. The conventional boundary-scan testing is particularly strong for detecting opens on a node. Shorts can be detected between two boundary-scan nodes if they are set to opposite values; one or the other respective sets of receivers will see incorrect data due to the short.

The test according to the invention provides apparatus and methods that are optimal for testing for shorts between a boundary-scan node and a conventional node. The technique of the invention is essentially a hybrid of boundary-scan and in-circuit shorts testing with the power turned on. Since, preferably, the board 100 has passed the conventional unpowered shorts testing, we can assume that shorts do not exist between accessible non-boundary-scan nodes. The powered shorts test according to the invention is carried out by tester 12 under the control of a program generated by computer 14. As in conventional boundary-scan testing, one of drivers 37 and receivers 38 is assigned to each of the external boundary-scan nodes and connected to the assigned node via one of relays 34. In addition, a test time limit for each of the non-boundary scan nodes to be tested may be determined. This test time limit is the time that a short between that non-boundary-scan node and a boundary scan node within the radius R can be tolerated. An overall time limit for the circuit as a whole may also be determined. This time limit would take into account possible shorts in inaccessible non-boundary-scan nodes. These time limits can be determined using the method and apparatus of U.S. Pat. No. 4,588,945 which is incorporated herein by reference. The boundary-scan nodes are then ordered for testing in the order corresponding to the order of the length of time limits associated with the non-boundary scan nodes in the sets $T_X$, with the boundary-scan node for which the set $T_X$ includes the node or nodes with the shortest time limit tested first.

Figure 3:
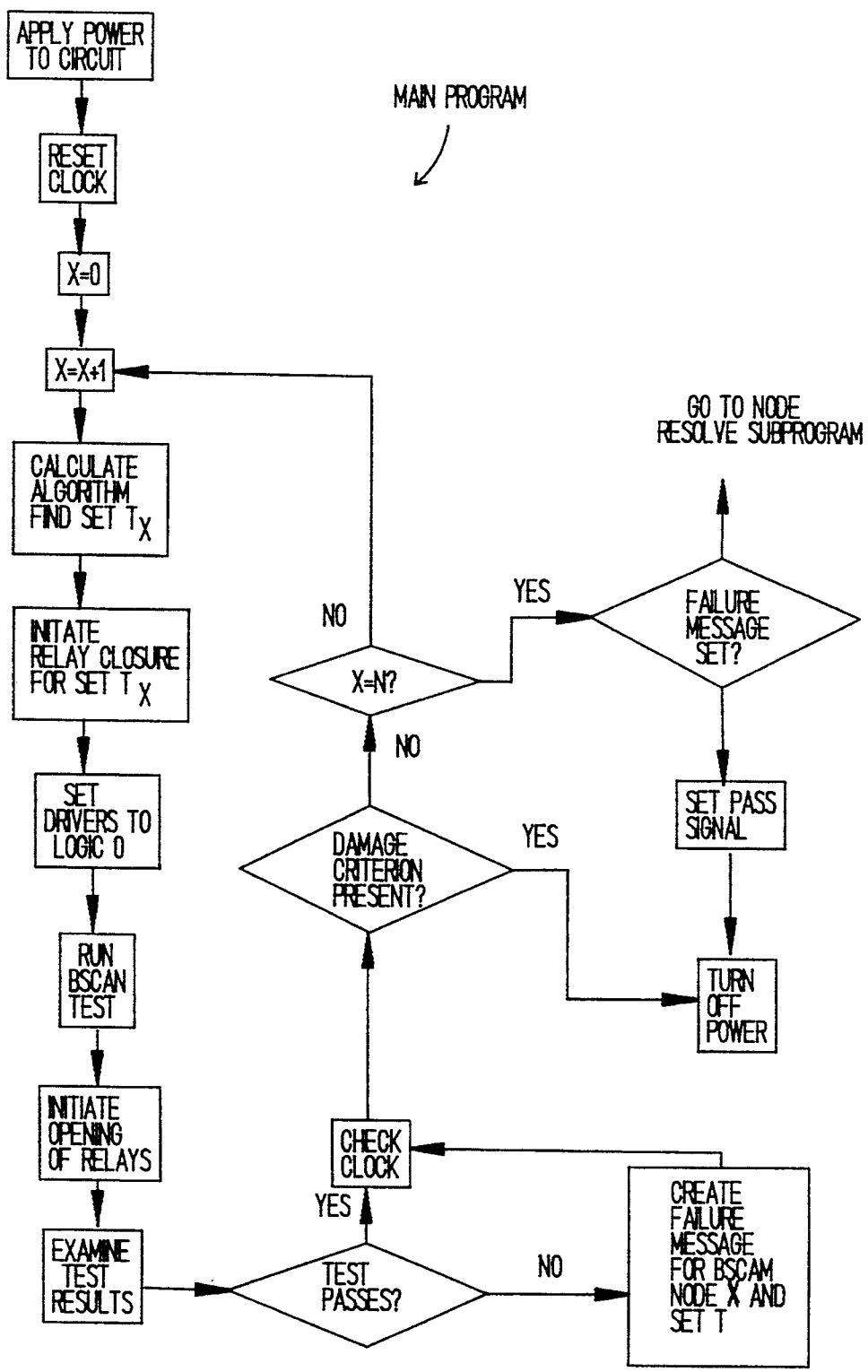
FIG. 3 shows a flow chart of a preferred embodiment of a main program for operating the apparatus of FIG. 1.

A flow chart of the main program is shown in FIG. 3. In this flow chart X designates the particular boundary-scan node and corresponding set of non-boundary-scan nodes being tested, and N is equal to the total number of boundary-scan nodes to be tested. To initiate the test, power is applied to the circuit to be tested. At essentially the same time, the clock 56 is reset and begins counting the time since the initiation of power. X is set to 0 and then incremented by one to set it to 1. Then the set $T_1$ of non-boundary scan nodes is calculated by a processor within controller/sequencer 54 or by remote computer 14, using the algorithm discussed above and (X,Y) data previously input, while the circuit is coming up to full power. As suggested above, this calculation could also be performed before the test is done in connection with the ordering of the boundary-scan nodes. In that case, this step would comprise the transferring of data regarding the nodes comprising the set $T_1$. An independent one of drivers 37 is assigned to each node in the set $T_1$ and connected to that node by closing of one of relays 34. While the relays 34 are traveling, the drivers for the set T1 are set to logic 0 and the boundary-scan test is set up by tester 12. The logic 0 value is chosen because it is most likely to be least damaging to most circuits, such as TTL circuits. If some other value is determined to be less likely to be damaging, then that value would be selected. Whatever logic value is chosen, it is applied using standard in-circuit overdrive techniques, so that no matter what the non-boundary scan devices, such as 61 and 62, are attempting to do with the attached nodes, such as 68 and 70 respectively, a value can be guaranteed. The boundary-scan test is then run. Preferably the boundary-scan EXTEST function is the boundary-scan test run. The boundary-scan EXTEST function puts every boundary-scan driver at logic 0, the responses of the corresponding boundary scan receivers on the corresponding nodes are captured, then the boundary-scan drivers are put at logic 1 and the responses at the receivers captured. For example, referring to FIG. 2, the boundary-scan driver on boundary-scan device 92 connected to node 90 is set to logic 0 which must be captured by the boundary-scan receivers on devices 94 and 96. Then driver of device 92 is set to logic 1 and this must be captured by the receivers of devices 94 and 96.

Immediately after the boundary-scan test is run, the opening of the relays attached to the non-boundary-scan nodes is initiated. While the relays are opening, the test results are analyzed. The results are read out by a processor within controller/sequencer 54, or by computer 14. The states of the boundary-scan node 90 are examined only at those points relevant to the test: that is, if boundary-scan node 90 were connected to other boundary-scan devices at pins where there were no non-boundary-scan pins within the radius R, then the value that the boundary-scan receivers at these pins captured would not be examined. This can shorten the test considerably if there are a preponderance of boundary scan devices. With the drivers for the set $T_1$ set to logic 0, if the logic 0 of the boundary-scan driver is not captured, a problem exists with either the corresponding boundary-scan driver or its associated interconnect. If a logic 1 of the boundary-scan drivers is not captured, then we know that a short condition exists between one or more of the nodes $T_1$ and the boundary-scan node. Since the non-boundary-scan nodes were driven at a logic 0 by a guaranteed driving technique, we are guaranteed that if a short exists between a non-boundary-node and a boundary-scan node, this test will pick it up. If the set $T_1$ passes, the clock 56 is checked. If the set $T_1$ does not pass the test, that is if a logic 1 is not captured (assuming the non-boundary-scan drivers are set at logic 0), then a failure message is created identifying the boundary-scan node tested and the set $T_1$, before the clock 56 is checked. Upon checking clock 56, if a damage criterion is present, that is, if one of the time limits associated with any of the boundary-scan nodes that have not yet been tested has expired, or if any one of the time limits associated with any one of the boundary-scan nodes that has been tested and has failed the test has expired, or if the overall circuit time limit has expired, then the power is turned off, Note that the expiration of a time limit while a loop is being executed is generally not a problem. Generally, the time limits are relatively large as compared to the time it takes to execute a loop, and the uncertainty or slack in the determination of the time limits is generally much larger than the loop execution time. If no damage criterion is present, then the value of X is checked to see if all the boundary scan nodes have been tested, and if not, X is incremented by one and the next boundary-scan node is tested. If all boundary-scan nodes have been tested, then the failure message record is examined and if no failure message was created then a pass signal is set indicating that the board has passed the test, and the test is terminated by turning the power to the board off.

Figure 4:
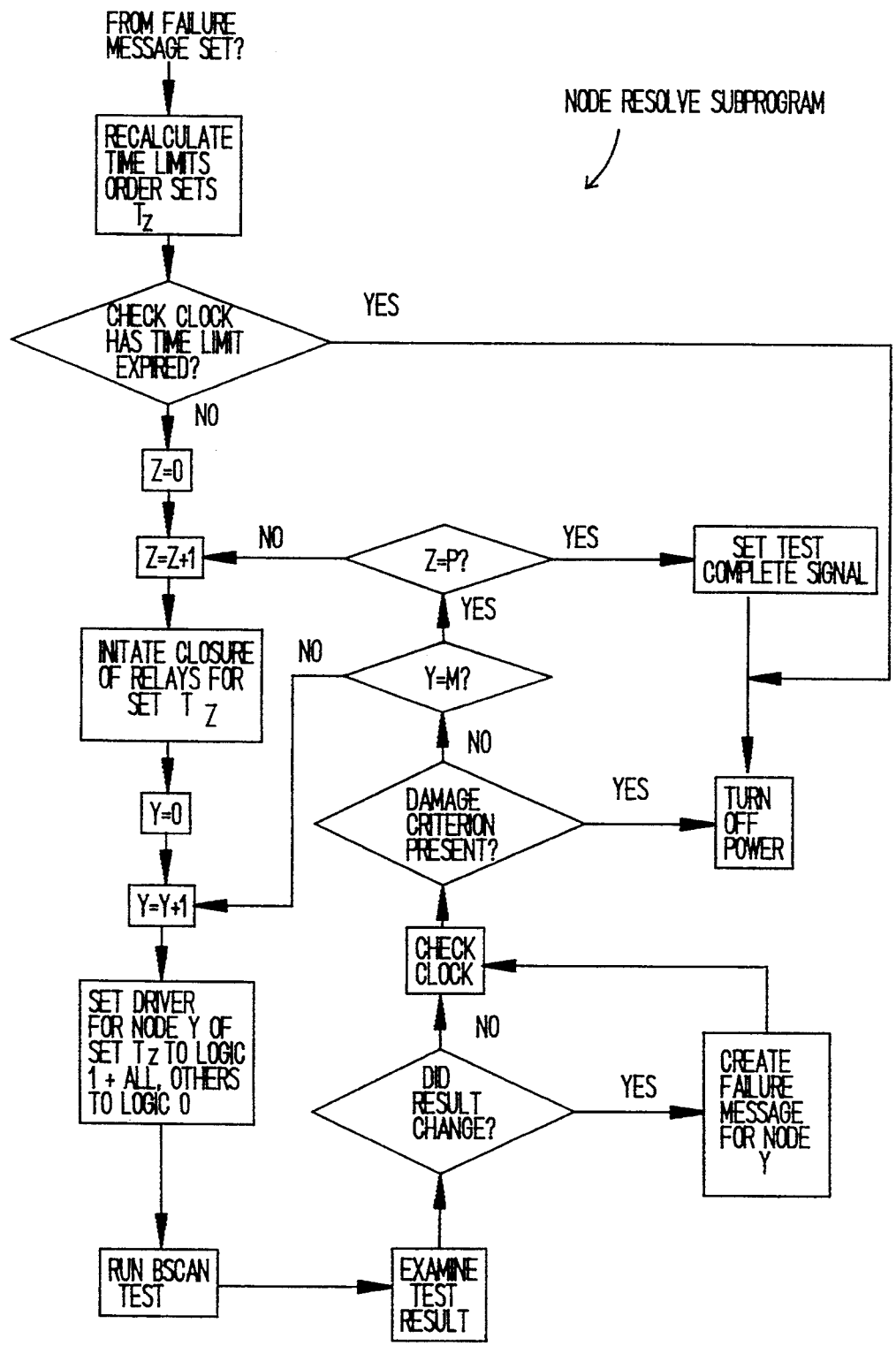
FIG. 4 shows the preferred embodiment of the subprogram to resolve the one of the non-boundary scan nodes that has the fault in a set of nodes for which a fault was found in the program of FIG. 3.

If a failure message is set in the main program, and the power has not been turned off due to the expiration of a time limit, then the Node Resolve Subprogram is entered. A flow chart of this subprogram is shown in FIG. 4. In this subprogram, Z designates the boundary-scan node and corresponding set of non-boundary-scan nodes, i.e. set $T_z$, being tested, P is equal to the number of boundary-scan nodes that failed the main program test and for which a failure message was created, Y designates the particular one of the set $T_z$ that is being tested, and M is equal to the number of non-boundary-scan nodes in the set $T_z$. At the initiation of this subprogram, the time limits are redetermined considering the fact that in this subprogram we may have digital drivers in opposite states shorted to each other. That is, in resolving the non-boundary-scan nodes, one is set to logic 1 and the others set to logic 0. It may be that there are multiple shorts to the boundary-scan node that result in two of the non-boundary-scan nodes being shorted to each other. This generally is a more serious situation than the situation in the main program where all non-boundary-scan nodes were set to the same logic state. This situation could not be tolerated as long, and the time limits would then be shorter. The sets $T_z$ are again ordered so the set having the shortest time limit is tested first, and so on. The clock is checked and compared to the new time limits calculated, and if one has expired, the power is turned off. If none of the newly calculated time limits has expired, then Z is set equal to 0 and incremented to set Z equal to 1. The individual drivers 37 are again assigned to each non-boundary-scan node in the set $T_Z$, and the closure of the relays 34 connecting the assigned drivers 37 and the nodes is initiated. While the relays are closing, the set of non-boundary-scan nodes in the set $T_Z$ may be ordered with the one with the shortest test time limit first. Y is set equal to 0 and then incremented to set it equal to 1. The driver for the first node of set $T_Z$ is set to a logic 1, and the drivers of all other nodes in set $T_Z$ are set to a logic 0. The boundary-scan EXTEST function is again run, and the results are analyzed. If the result changed from the prior test for that boundary-scan note and set $T_Z$, then a failure message is created for that node, and the clock is checked. If the result did not change, the clock is checked without creating a failure message. If there is a damage criterion present, that is if any of the time limits for non-boundary-scan nodes for which a failure message had been created has expired, or if any of the time limits for non-boundary-scan nodes in the sets $T_Z$ that have not yet been tested to resolve the fault have expired, or if the overall circuit time limit has expired, then the power is turned off. If no damage criterion is present, then Y is checked to see if all nodes in set $T_Z$ have been tested, and if not, Y is incremented and the next node in set $T_z$ is tested. If all nodes in the set $T_Z$ have been tested, then Z is checked to see if all sets $T_Z$ have been tested. If not, Z is incremented and the next set for which a failure message was created is tested. If all the sets $T_Z$ for which a failure message was created have been tested, then a test completed signal is set, and the test is terminated by turning off the power to the circuit 100. After the above tests have been completed, a standard boundary-scan interconnect test is run that verifies the integrity of just the boundary-scan nodes alone.

In the preferred embodiment, tester 12 is a Hewlett Packard HP3070 tester and computer 14 is a Hewlett Packard HP9000 computer, although other suitable testers and computers could be used. The HP9000 computer is equipped with data inputs 16 and data outputs 18 such as a keyboard, disk and tape drives and a display.

A feature of the invention is that the use of the shorting radius allows a great reduction in the number of nodes that must be tested. As mentioned above, there may be hundreds or thousands of nodes and nails in a typical circuit to be tested. A great majority of these nodes and nails will not be able to short to a given target node because of the lack of physical proximity. The use of the shorting radius rules out shorts that are highly improbable in actual occurrence. It allows the software to pick a small subset of the nails to consider against each target boundary-scan node. The smallness of this subset greatly reduces the number of digital resources that must be made available and must be controlled in parallel, the amount of diagnostic information that must be analyzed and printed, and the time required to run a definitive test. Thus the invention greatly reduces the cost of testing a circuit as compared to prior art testing apparatus and methods.

Another feature of the invention is that shorts are found as early as possible with the risk of associated damage minimized. This results from the series of tests performed, i.e. the unpowered shorts, the mixed test, and the boundary scan interconnect test, and also from the ordering of the nodes to be tested within the mixed test and the use of time limits to temporarily shut down the power.

A further feature of the invention is the elimination of diagnostic confusion that resulted from prior art boundary-scan testing of mixed circuits. In the prior art testing, shorts that were present would cause interactions between boundary-scan components and uncontrolled non-boundary-scan circuit components, which interactions could not be predicted, repeated, or analyzed. In the mixed test according to the invention, such uncertainty and confusion is eliminated by isolating the boundary scan nodes, reducing the non-boundary-scan nodes to a manageable number which we know are not shorted to each other, and forcing the non-boundary-scan notes to guaranteed states. Another feature of the invention is that it can be implemented using testers and computers that are generally available in test facilities. Further, the techniques and programming required are relatively easily understood by testing personnel. Sophisticated mathematics is not required.

There has been described novel apparatus and methods for boundary-scan testing of mixed circuits which provides accurate, definitive, and fast testing of complex circuits and which has many other advantages. It should be understood that the particular embodiments shown in the drawings and described within this specification is for purposes of example and should not be construed to limit the invention which will be described in the claims below. Further, it is evident that those skilled in the art may now make numerous uses and modifications of the specific embodiment described, without departing from the inventive concepts. For example, now that it is seen to be possible to use the (X,Y) data to simplify the testing of circuits, other means which reduces the sets of nodes to be tested by using (X,Y) information may be devised. Or other testers and computers may be used, or other electrical components may be substituted. Other features may be added, or one or the other of the optional features may be deleted. Consequently, the invention is to be construed as embracing each and every novel feature and novel combination of features present in and/or possessed by the described.

What is claimed is:

1. A method of testing a circuit board using a data processor providing reduced processing time for the data processor, the circuit board having:
   (i) a plurality of non-boundary scan (NBS) devices, each of the NBS devices having a number of NBS pins for electrically coupling to the circuit board;
   (ii) a plurality of boundary-scan (BS) devices, each BS device having a number of BS pins for electrically coupling to the circuit board, the number of BS pins serially coupled together to form a boundary scan path, wherein the boundary scan path provides a serial data stream representing a logic state on each of the number of BS pins to the data processor for analysis;
   (iii) a number of BS nodes wherein each BS node is coupled to at least one BS pin of the boundary-scan path so as to accept an applied voltage from the boundary scan path and to provide a resultant logic state on the at least one BS pin to the boundary scan path, and
   (iv) a number of NBS nodes, each of the NBS nodes coupled to at least one NBS pin, the method comprising the steps of:
   selecting one of the number of BS nodes;
   determining a first set of pins comprising all BS and NBS pins that are coupled to the selected BS node;
   determining a second set of pins comprising all BS and NBS pins coupled to one of the number of NBS nodes and that are within a predetermined distance on the circuit board of any of the first set of pins;
   applying a voltage corresponding to a first logic state from the boundary scan path to all BS nodes in the first set of pins;
   applying a voltage corresponding to a second logic state to at least one of the second set of pins;
   causing the boundary scan path to capture the resultant logic states provided by each BS pin of each of the number of BS nodes coupled to the boundary scan path;
   causing the boundary scan path to provide a first serial data stream to the data processor;
   determining a subset of the first set of pins, the subset comprising all of the first set of pins that are within the predetermined distance of any one of the second set of pins; and
   analyzing only a first portion of the first data stream using the data processor, the first portion of the first data stream including logic states provided to the boundary scan path by the subset of the first set of pins so as to reduce the time required for the data processor to analyze the first data stream.

2. The method of claim 1 wherein the step of determining the second set of pins comprises the steps of:
   storing information about an (X,Y) position of each BS pin and each NBS pin on the circuit board in the data processor;
   providing the predetermined distance to the data processor; and
   causing the data processor to determine the second set of pins using the stored information.

3. The method of claim 1 wherein the step of determining the subset of the first set of pins comprises the steps of:
   storing information about an (X,Y) position of each BS pin and each NBS pin on the circuit board in the data processor;
   providing the predetermined distance to the data processor; and
   causing the data processor to determine the subset of the first set of pins using the stored information.

4. The method of claim 3 wherein the analyzing step further comprises causing the data processor to ignore all of the second portion of the data stream using the stored information on the (X,Y) position of each BS and NBS pin, thereby reducing the total quantity of data from the first serial data stream used during the analyzing step.

5. The method of claim 3 wherein the predetermined distance is related to a physical span of a defect causing an electrical short on the circuit board.

6. The method of claim 3, wherein after the step of causing the scan path to provide the first serial data stream, the method further comprises the steps of:

applying a voltage corresponding to the second logic state from the boundary scan path to the first set of pins;

applying a voltage corresponding to the first logic state to the second set of pins;

causing the boundary scan path to capture the resultant logic states provided by each BS pin of each of the number of BS nodes coupled to the boundary scan path; and causing the boundary scan path to provide a second data stream to the data processor.

7. The method of claim 6 wherein the step of analyzing further comprises the step of analyzing only a first portion of the second data stream, the first portion of the second data stream including the captured resulting logic states provided to the boundary scan path by the subset of the first set of pins.

8. The method of claim 6 wherein after the step of causing the scan path to capture, the method further comprises:

immediately removing the predetermined voltage from the second set of pins; and selecting another of the number of BS nodes without applying any voltage to the second set of pins;

determining a third set of pins comprising all BS and NBS pins that are coupled to the other selected BS node;

determining a fourth set of pins comprising all BS and NBS pins coupled to one of the number of NBS nodes and that are within the predetermined distance of any of the third set of pins; and determining if a short circuit exists between any of the third set of pins and any of the fourth set of pins.

* * * * *